United States Patent
Makino et al.

(10) Patent No.: US 7,049,883 B2
(45) Date of Patent: May 23, 2006

(54) SWITCHED-CAPACITOR LOW-PASS FILTER AND SEMICONDUCTOR PRESSURE SENSOR APPARATUS INCORPORATING THE FILTER

(75) Inventors: Takanori Makino, Oogaki (JP); Seiki Aoyama, Toyohashi (JP)

(73) Assignee: Denso Corporation, Kariya (JP)

( * ) Notice: Subject to any disclaimer, the term of this patent is extended or adjusted under 35 U.S.C. 154(b) by 70 days.

(21) Appl. No.: 10/791,790

(22) Filed: Mar. 4, 2004

(65) Prior Publication Data

US 2004/0174209 A1    Sep. 9, 2004

(30) Foreign Application Priority Data

Mar. 6, 2003   (JP) .............................. 2003-059879
Dec. 25, 2003  (JP) .............................. 2003-429828

(51) Int. Cl.
*H03K 5/00*   (2006.01)

(52) U.S. Cl. ........................................ 327/558; 327/554

(58) Field of Classification Search ........ 327/552–559, 327/337, 84, 94

See application file for complete search history.

(56) References Cited

U.S. PATENT DOCUMENTS

| | | | |
|---|---|---|---|
| 5,245,344 A | | 9/1993 | Sooch |
| 6,191,648 B1* | | 2/2001 | Lewicki ...................... 327/554 |
| 6,573,785 B1* | | 6/2003 | Callicotte et al. .............. 330/9 |

FOREIGN PATENT DOCUMENTS

| | | |
|---|---|---|
| JP | 63-219219 | 9/1988 |
| JP | A-S63-299406 | 12/1988 |
| JP | 9-27731 | 1/1997 |
| JP | 9-199994 | 7/1997 |
| JP | 2001-165797 | 6/2001 |
| JP | 2002-39888 | 2/2002 |

* cited by examiner

*Primary Examiner*—Dinh T. Le
(74) *Attorney, Agent, or Firm*—Posz Law Group, PLC

(57) ABSTRACT

A low-pass filter configured as a switched capacitor circuit in which capacitor charge switching is performed by 2-phase clock signals that control respective sets of switching elements, wherein an interval between a first-phase clock signal pulse and a succeeding second-phase clock signal pulse, during which no charging/discharging of capacitors should occur, is made as short as possible while ensuring that the two sets of switching elements cannot enter the ON state simultaneously. A low cut-off frequency can thereby be achieved, while using very small capacitor values.

6 Claims, 7 Drawing Sheets

SWITCHED-CAPACITOR LOW-PASS FILTER AND SEMICONDUCTOR PRESSURE SENSOR APPARATUS INCORPORATING THE FILTER

BACKGROUND OF THE INVENTION

1. Field of Technology

The present invention relates to a low-pass filter formed of a switched capacitor circuit, and to a semiconductor pressure sensor apparatus which utilizes such a low-pass filter.

2. Description of Prior Art

Due to their advantages of being small in size and having high performance, various types of semiconductor pressure sensor apparatus are utilized in applications such as for pressure detection within the air intake pipes or exhaust pipes of vehicle engines, or in non-vehicle applications such as in gas meters, etc. Since a semiconductor pressure sensor has excellent response characteristics, they are suitable for use in detecting rapid changes in pressure. However, the high speed of response of a semiconductor pressure sensor is a disadvantage in applications in which it is required to detect average changes in pressure, with high-frequency components of the pressure changes being excluded. In such a case, in which it is required to extract low-frequency components of the pressure changes, it is necessary to use a low-pass filter to remove the high-frequency components from a detection signal that is obtained from a semiconductor pressure sensor.

FIG. 7 is a circuit diagram of an example of a prior art type of semiconductor pressure sensor apparatus. With this apparatus, a detection signal that is generated by a semiconductor pressure sensor 1 is amplified by a differential amplifier 2, and the resultant output signal is transferred through a low-pass filter 3, to thereby obtain an output signal voltage that contains only low-frequency components of the pressure changes that are detected by the semiconductor pressure sensor 1.

The semiconductor pressure sensor 1 can for example be formed of a diaphragm constituted by a plate of silicon having a region that is made relatively thin, with piezoresistive elements G1~G4 (i.e., elements which exhibit a change in resistance when subjected to distortion) formed on a surface of the diaphragm. When pressure is applied to the diaphragm, causing shape distortion to occur, the respective resistance values of the piezoresistive elements G1~G4 are altered. The piezoresistive elements G1~G4 are connected in a bridge configuration, so that when pressure is applied to the diaphragm then for example a potential Vp1 that appears between the mutual connection points of the piezoresistive elements G2 and G3 may be increased, while a potential Vp2 that appears between the mutual connection points of the piezoresistive elements G1 and G4 may be decreased.

The potentials Vp1, Vp2 that appear between the mutual connection points are amplified by the differential amplifier 2, to obtain an output signal having an instantaneous value of voltage designated as Vo, whose value is proportional to the voltage difference (Vp1–Vp2). Since that output signal contains high-frequency components, it is passed through the low-pass filter 3 to obtain an output signal that contains only low-frequency components, and whose instantaneous voltage value is designated as Vout.

In the following it will be assumed that switches which perform capacitor switching are implemented as FETs (field effect transistors), each controlled by a control voltage signal applied to a gate electrode, and with the ON/OFF conditions of the switch corresponding to conducting/non-conducting conditions, respectively, between the drain and source electrodes of the FET.

Usually, the low-pass filter 3 is configured as a switched capacitor circuit that is formed in an integrated circuit. The capacitor switching is performed by switches S11, S12, S13, S24, S25, S26 which are respective analog switches (where the term "analog switch" is used herein to signify a switching element constituted by a semiconductor switch device such as a MOS FET) controlled by control signals that are constituted by first and second clock signals $\phi 1$, $\phi 2$ shown in the timing diagram of FIG. 8, and are generated by a clock pulse signal generating circuit 30. FIG. 8 illustrates the phase relationships of the two-phase clock signals $\phi 1$, $\phi 2$ when each of these has a frequency of 150 kHz. Each of the set of switches S11, S12, S13 is set in the ON (i.e., conducting) state when the first clock signal $\phi 1$ is at the active level (assumed to be the high level, in the example of FIG. 8), while each of the set of switches S24, S25, S26 is set in the conducting state when the second signal $\phi 2$ is at the active level.

When the analog switches S11~S13 and S24~S26 are controlled as described above by the two-phase clock signals $\phi 1$, $\phi 2$ with the timing relationships shown in FIG. 8, the equivalent circuit of the operation becomes as shown in FIG. 6, i.e., with the circuit functioning as a low-pass filter. The values of the resistors R1, R2 and the cut-off frequency fc of that equivalent circuit are obtained (designating the frequency of each of the two-phase clock signals $\phi 1$, $\phi 2$ as fs, the respective capacitance values of the capacitors C1, C2 C3 as c1, c2, c3 and the resistance value of the resistors R1, R2 as r1, r2 respectively) from the following equations:

$$r1 = 1/(fs. \, c1) \tag{1}$$

$$r2 = 1/(fs. \, c2) \tag{2}$$

$$fc = 1/(2\pi. \, r2. \, c3) = fs. \, c2/(2\pi. \, c3) \tag{3}$$

With a usual type of semiconductor pressure sensor apparatus, the cut-off frequency fc is generally required to be approximately 100~400 Hz. If for example the cut-off frequency is 100 Hz, then the values c2=0.25 pf, c3=60 pf, fs=150 kHz, can be used. Such capacitance and frequency values can readily be obtained by using devices that are formed in an integrated circuit.

However considering the case in which a substantially lower value of cut-off frequency is required, e.g., 1 Hz, then if the values for the frequency fs of the two-phase clock signals $\phi 1$, $\phi 2$ and for the capacitor C2 are made the same as in the above numeric example, the value of capacitor C3 must be multiplied by 100, i.e., to be made 6,000 pf. In practice, it is not possible to realize such a large value of capacitance by a capacitor that is formed in a semiconductor integrated circuit.

Thus, since it would not be practicable to substantially reduce the value of capacitor C2 below approximately 0.25 pf, it would be necessary to lower the frequency fs of the two-phase clock signals $\phi 1$, $\phi 2$ by a factor of 1:100, i.e., to approximately 1.5 kHz, in order to achieve a value of cut-off frequency as low as 1 Hz with such a prior art type of low-pass filter.

The phase relationship between the two-phase clock signals $\phi 1$, $\phi 2$ during one clock period, in the case of a prior art type of apparatus in which the frequency of each of the two-phase clock signals $\phi 1$, $\phi 2$ is 150 kHz will be considered referring again to the timing diagram of FIG. 8, and to FIGS. 5A to 5D. FIGS. 5A to 5D respectively illustrate successive conditions attained by the low-pass filter 3 (when formed as the switched capacitor circuit shown in FIG. 7) during four successive time intervals within a clock period, designated as Phase 1, Phase 2, Phase 3 and Phase 4.

Firstly as shown in FIG. 5A, during Phase 1, the capacitor C1 becomes charged to the input voltage Vo, while conversely the capacitor C2 is discharged, to reach a charge of zero. The charge in the capacitor C3 is left unchanged.

Next, considering Phase 2, as shown in FIG. 5B all of the switches S11, S12, S13, S24, S25, S26 are in the OFF (i.e., open) state, so that the charge in each of the capacitors C1, C2, C3 is left unchanged. Thus, during Phase 2, the respective voltages developed across the capacitors are left unchanged from those which existed at the end of Phase 1.

Next, considering Phase 3, as shown in FIG. 5C the capacitors C2 and C3 become connected in parallel, and the capacitor C1 becomes connected between the inverting input terminal and the non-inverting input terminal of the operational amplifier OP1. Since the inverting input terminal and the non-inverting input terminal of the operational amplifier OP1 are held at the same potential the capacitor C1 becomes discharged. The resultant discharge current flow acts to charge each of the capacitors C2, C3. The capacitor C2 becomes finally charged to the output signal voltage Vout that is being produced from the operational amplifier OP1 at that point in time. The amount of charging current which flows into the capacitor C3 is equal to the amount of discharge current which flows from the capacitor C1, with the charge voltage of the capacitor C3 changing accordingly. Since the voltage to which the capacitor C3 becomes charged is necessarily identical to the output voltage Vout from the operational amplifier OP1, the amount of change of that output voltage Vout is equal to the amount of change in the voltage to which the capacitor C3 is charged.

Next, considering Phase 4, as shown in FIG. 5D all of the switches S11, S12, S13, S24, S25, S26 are in the OFF state, in the same way as for the condition during Phase 3. Thus, each of the capacitors C1, C2, C3 is left in the same condition of charge as that which existed at the end of Phase 3.

However a problem arises with respect to a change in the charge voltages of the capacitors C1, C2 during the Phase 2 interval. Immediately after the start of Phase 2, the amount of charge in the capacitor C1 is Vo.C1, while amount of charge in the capacitor C2 is zero. Since the amount of area that is available on the substrate of a semiconductor integrated circuit is extremely small, each capacitor can only have a maximum value that is very small. In addition as can be understood from equation (3) above, the value of capacitor c2 should be as small as possible, to achieve a low value of cut-off frequency for the low-pass filter, e.g., 0.25 pF. When the amount of capacitance is extremely small, then when analog switches that are respectively connected between the terminals of a capacitor and ground potential are set in the OFF state, even a tiny amount of leakage current that flows in these analog switches will have a substantial effect upon the voltage to which the capacitor is charged.

The term "leakage current" is used here to refer to a total amount of leakage current flow, which is determined by such factors as the finite amount of resistance that exists between the drain and source electrodes of a FET constituting an analog switch, when in the OFF state, and also by the leakage current that flows in the PN junction that exists between the region below the drain and source electrodes and the substrate, etc. The leakage current magnitude increases in accordance with increases in operating temperature. Referring again to the timing diagram of FIG. 8, since the cut-off frequency fc is 100 Hz, and the duration of a Phase 2 interval is 1.7 microseconds and so is extremely short, the effects of leakage current during that interval can in practice be ignored. However if the capacitor values were to be left unchanged, and the cut-off frequency fc were to be lowered to 1 Hz, then it would be necessary to lower the frequency fs of the two-phase clock signals $\phi 1$, $\phi 2$ to become 1.5 kHz as described above. If that is done, then the duration of a Phase 2 interval becomes multiplied by a factor of 100, i.e., to become 170 microseconds. In that case, with all of the switches S11, S12, S13, S24, S25, S26 in the OFF state during such a long-duration Phase 2 interval, the amount of charge in the capacitors C1, C2 will change substantially during that interval, due to leakage current flow in the switches that are connected on each side of each of these capacitors.

As a result the problem arises that an error will arise in the gain of the low-pass filter 3 in the low-frequency range and in the actual cut-off frequency of the low-pass filter (i.e., by comparison with the cut-off frequency that is derived from equation (3)).

SUMMARY OF THE INVENTION

It is an objective of the present invention to overcome the problems of the prior art set out above, by providing a low-pass filter that is configured as a switched capacitor circuit, whereby even when the frequency of the two-phase clock signals $\phi 1$, $\phi 2$ is made substantially lower than has been the practice in the prior art, in order to achieve a very low value of cut-off frequency for the filter (for example, approximately 1 Hz) and the values of capacitors used in the switched capacitor circuit are made sufficiently small to enable the capacitors to be readily manufactured within a semiconductor integrated circuit, the operation of the low-pass filter will be substantially unaffected by leakage currents which flow in switching elements of the switched capacitor circuit.

Basically, the present invention is applicable to a low-pass filter that is configured as a switched capacitor circuit, and is used to detect variations in voltage of an input signal, such as a detection signal from a pressure sensor or an amplified detection signal from a pressure sensor. Such a switched capacitor circuit includes first and second capacitors that are fixedly connected in series, and an operational amplifier having a third capacitor fixedly connected between its output terminal and a non-inverting input terminal. The input signal to the low-pass filter is applied between an input terminal of the filter and the non-inverting input terminal of the operational amplifier. The switched capacitor circuit also includes first and second sets of switching elements operable for establishing a plurality of respectively different connection conditions between the first, second and third capacitors and the input terminal of the low-pass filter, and switching control means for selectively setting all of the first plurality of switching elements in a conducting state and in a non-conducting state and for selectively setting all of the second plurality of switching elements in a conducting state and in a non-conducting state, to establish the different connection conditions in a predetermined sequence. Specifically, the switching control means periodically controls the switching elements to sequentially establish:

(a) during a first time interval (Phase 1), a condition in which the first capacitor is charged to the voltage of the input signal, while the second capacitor is discharged to zero and the charge of the third capacitor is left unchanged, (b) during a second time interval (Phase 2), a condition in which no charging or discharging of the capacitors occurs, (c) during a third time interval (Phase 3), a condition in which the second and third capacitors are connected in parallel between the output terminal and inverting input terminal of the operational amplifier and are each charged from the first capacitor, while the first capacitor is discharged to zero, with a corresponding change in the voltage across the third capacitor and a resultant change in output voltage from the operational amplifier, and (d) during a fourth time interval (Phase 4), a condition in which no charging or discharging of the capacitors occurs.

A basic feature of the present invention is that of providing such a low-pass filter, in which the switching control means is configured to establish as short a duration as possible for the second time interval (Phase 2), within a range of durations whereby none of the first set of switching elements can enter the conducting status concurrently with any of the second set of switching elements.

Since in general the switching elements are implemented as semiconductor devices (e.g., MOS FET transistors), the maximum possible duration for the second time interval will increase in accordance with increased operating temperature of the low-pass filter, due to leakage of charge to or from the capacitors because of leakage currents of the switching elements that are connected to each side of each capacitor. Such leakage currents increase in accordance with increasing temperature. Hence, the "shortest possible duration" is preferably established as the shortest duration whereby none of the first set of switching elements can enter the conducting status concurrently with any of the second set of switching elements when the low-pass filter is functioning at a predetermined maximum operating temperature.

In addition, the shortest possible duration for the second time interval may be established based on the maximum amount of error that is permissible in the DC gain of the low-pass filter. The amount of that error varies substantially in proportion to the amount of change in charge voltage that occurs in the aforementioned second capacitor during the second time interval. Thus for example if the maximum amount of error that is permissible in the DC gain of the low-pass filter is 3%, then the shortest possible duration for the aforementioned second time interval can be established as "a duration for the second time interval whereby the amount of charge in the second capacitor during that time interval does not change by more than 3%".

It is a further objective to provide a semiconductor pressure sensor apparatus that utilizes such a low-pass filter. To achieve that objective, the invention provides a semiconductor pressure sensor apparatus comprising a semiconductor substrate having a region thereof formed to be thinner than surrounding regions to thereby constitute a diaphragm, a first pair of piezoresistive elements mounted on the diaphragm, each adapted to exhibit an increase in resistance when pressure is applied to the diaphragm, a second pair of piezoresistive elements mounted on the diaphragm, each adapted to exhibit a decrease in resistance when pressure is applied to the diaphragm, the piezoresistive elements being connected as an electrical bridge circuit, having a first connection point that connects a first one of the first pair of piezoresistive elements to a first one of the second pair of piezoresistive elements, a second connection point that connects a second one of the first pair of piezoresistive elements to a second one of the second pair of piezoresistive elements, a third connection point that connects the first one of the first pair of piezoresistive elements to the second one of the second pair of piezoresistive elements, and a fourth connection point that connects the second one of the first pair of piezoresistive elements to the first one of the second pair of piezoresistive elements, a source of an electric current that is passed between the first and second connection points, a differential amplifier for amplifying a voltage difference between the second and third connection points, and a low-pass filter according to the present invention.

Specifically, an amplified output signal produced from the differential amplifier is supplied to the low-pass filter, for thereby detecting variations in pressure applied to the diaphragm.

DESCRIPTION OF PREFERRED EMBODIMENTS

Figure 1:
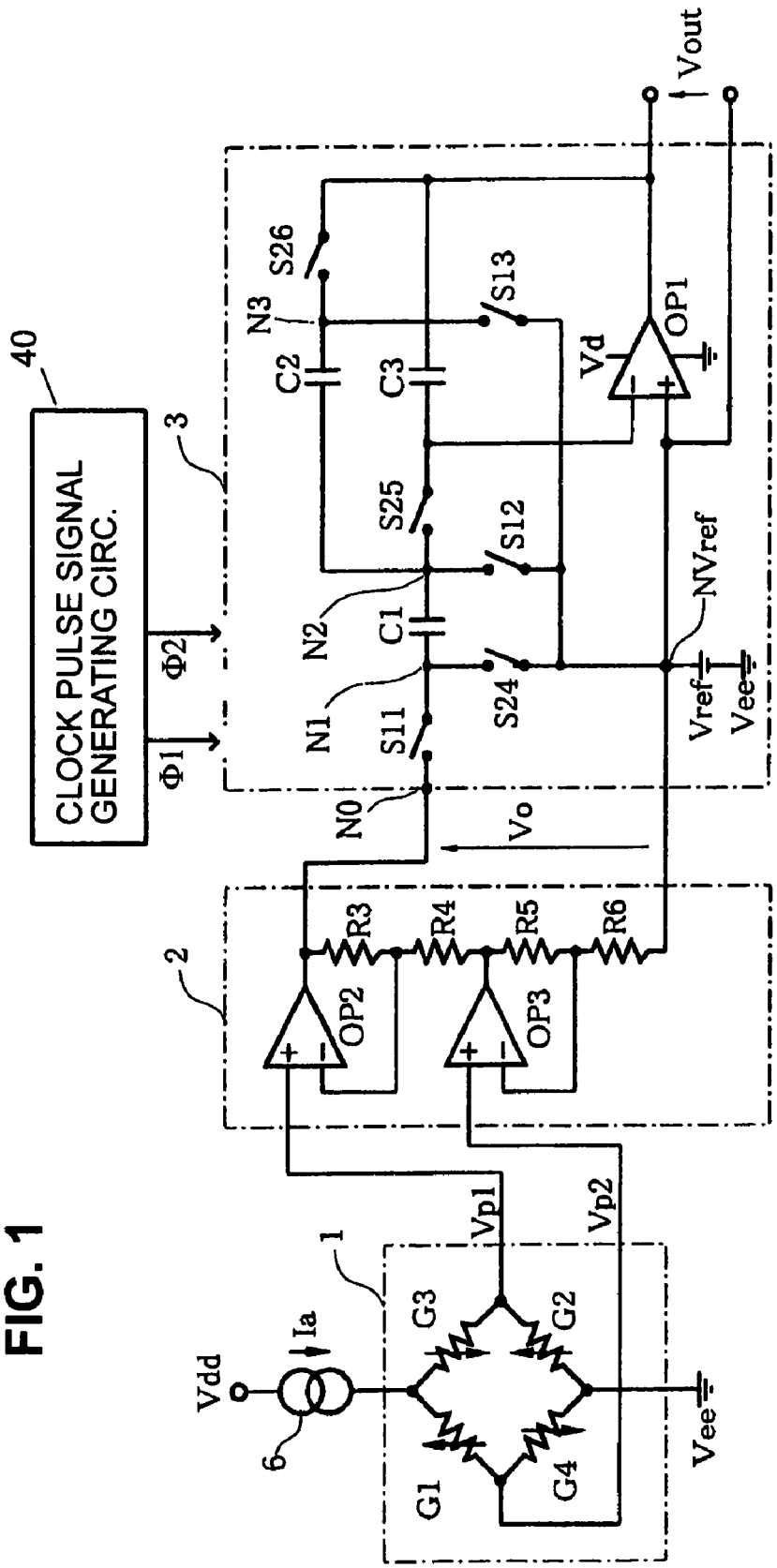
FIG. 1 shows the electrical configuration of an embodiment of a semiconductor pressure sensor apparatus.

FIG. 1 is a circuit diagram showing an embodiment of a semiconductor pressure sensor apparatus which incorporates a low-pass filter 3, implemented as a switched capacitor circuit. Components in FIG. 1 corresponding to components of the prior art example of FIG. 7 described above are designated by identical reference numerals to those of FIG. 7. It can thus be understood that the respective configurations of the semiconductor pressure sensor 1, the differential amplifier 2 and the low-pass filter 3 may be similar to those of the prior art example of FIG. 7. However a clock pulse signal generating circuit 40 of this embodiment is configured to operate in a different manner from the prior art example, as described in the following.

Figure 3A:
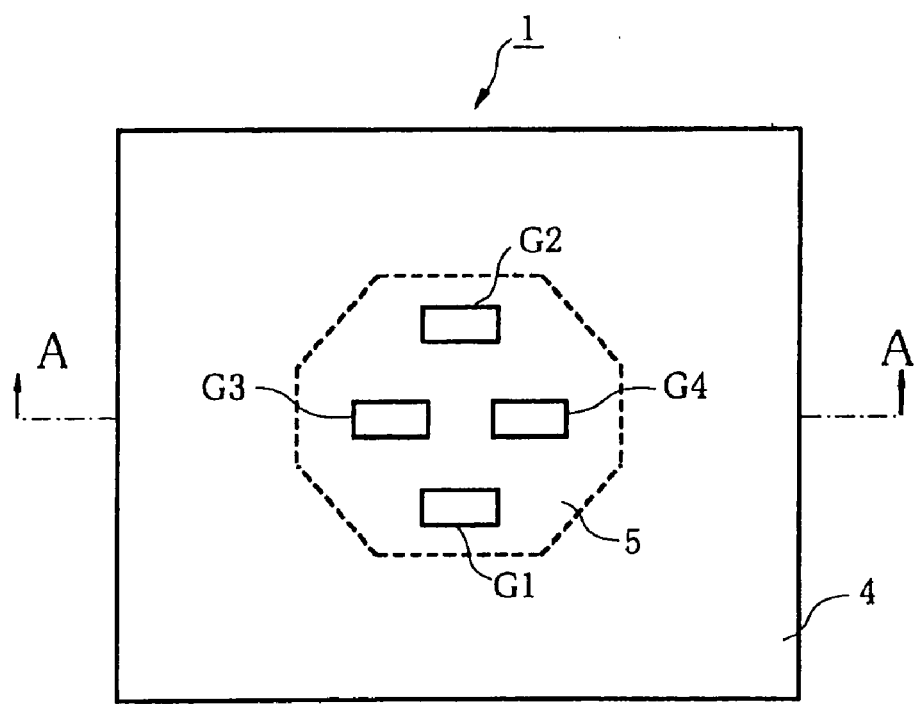
FIGS. 3A, 3B show the configuration of a pressure sensor element which may be used with the above embodiment.
Figure 3B:
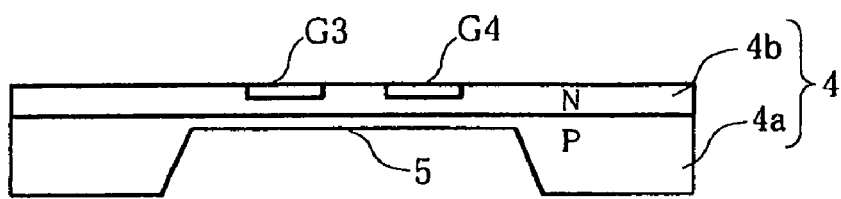

FIG. 3A is a plan view of a semiconductor pressure sensor 1 which is used in the embodiment of FIG. 1, while FIG. 3B is a cross-sectional view in elevation of the semiconductor pressure sensor 1, taken along the line A—A in FIG. 3A.

Figure 2:
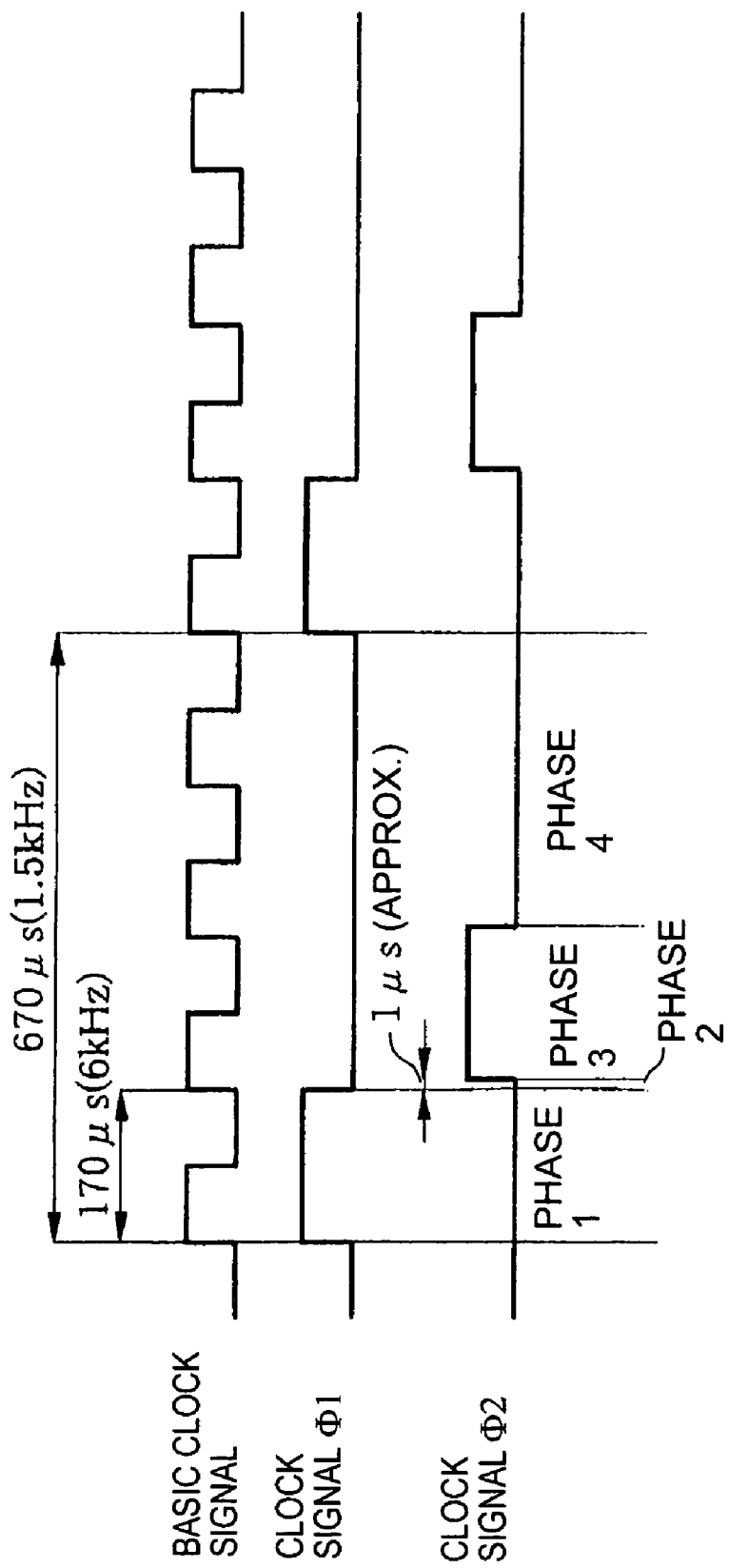
FIG. 2 is a timing diagram for illustrating timing relationships between two-phase clock signals that are utilized in a switched capacitor type of low-pass filter circuit in the embodiment of FIG. 1.

FIG. 2 is a timing diagram showing timing relationships between two-phase clock signals $\phi 1$, $\phi 2$ of this embodiment, generated by the clock pulse signal generating circuit 40, which controls the switches of the low-pass filter 3 in the embodiment of FIG. 1.

Referring to FIGS. 3A, 3B, the semiconductor pressure sensor 1 includes a semiconductor substrate 4, having an N-type layer 4b formed by epitaxial growth on a P-type silicon substrate 4a. The substrate 4a has a central region that is shaped to be thinner than the peripheral region of that substrate, and that central region in conjunction with the N-type epitaxial layer 4b constitutes a thin diaphragm 5.

The piezoresistive elements G1~G4, each formed by diffusion of P-type impurities, are disposed on a surface of the diaphragm 5. When pressure is applied to the diaphragm 5, the diaphragm 5 and the piezoresistive elements G1~G4 become distorted, the resistance of each of the piezoresistive elements G1, G2 becomes increased while the resistance of each of the piezoresistive elements G3, G4 becomes decreased. The piezoresistive elements G1~G4 are connected in a bridge circuit as shown in FIG. 1, in which the piezoresistive elements G1~G4 are indicated as respective variable resistors.

A current source 6 supplies a fixed value of current Ia that flows into the mutual connection point of the piezoresistive elements G1, G3, with that current then flowing to ground potential through the mutual connection point of the piezoresistive elements G2, G4. When pressure is applied to the diaphragm 5, with such a circuit configuration, an amount of voltage increase (designated as Vp1 in FIG. 1) will be assumed to be produced at the mutual connection point of the piezoresistive elements G2, G3, with an amount of voltage decrease (designated as Vp2 in FIG. 1) being produced at the mutual connection point of the piezoresistive elements G1, G4. The voltage difference (Vp1–Vp2) varies in substantially direct proportion to variations in the pressure that is applied to the diaphragm 5.

The voltage difference (Vp1–Vp2) is amplified by the differential amplifier 2, to obtain the output signal having the voltage value Vo as shown in FIG. 1.

Various configurations may be used for the differential amplifier 2. With the specific circuit configuration shown in FIG. 1, the differential amplifier 2 is formed of a pair of operational amplifiers OP2, OP3 and four resistors R3, R4, R5, R6. The potentials Vp1, Vp2 which are developed by the semiconductor pressure sensor 1 as described above are applied to the non-inverting input terminals of the operational amplifiers OP2, OP3 respectively. The resistors R3, R4, R5, R6 are connected in series between the output terminal of the operational amplifier OP2 and a mutual connection node NVref that is held at a potential which is higher than ground potential by a reference voltage value Vref. The resistor R3 is connected between the output terminal and the non-inverting input terminal of the operational amplifier OP2, while the resistor R5 is connected between the output terminal and the non-inverting input terminal of the operational amplifier OP3.

One end of the resistor R6 is connected to the mutual connection node NVref. The voltage that appears between the output terminal of the operational amplifier OP2 and the mutual connection node NVref is proportional to the output voltage value from the differential amplifier 2. Specifically, assuming that all of the resistors R3, R4, R5, R6 have the same value, the output voltage Vo is equal to 2(Vp1–Vp2).

The output voltage Vo from the differential amplifier 2 is supplied to the low-pass filter 3, which is constituted by a switched capacitor circuit having the configuration described above referring to the prior art example of FIG. 7. That is to say, the low-pass filter 3 is formed of an operational amplifier OP1, first, second and third capacitors C1, C2, C3, a set of first, second and third analog switches S11, S12, S13 each of which is set in the conducting state when the first clock signal $\phi 1$ of the two-phase clock signals $\phi 1$, $\phi 2$ is at the active level, and a set of fourth, fifth and sixth analog switches S24, S25, S26 S13 each of which is set in the conducting state when the second clock signal $\phi 2$ is at the active level.

With this embodiment, the operational amplifier OP1 is supplied with power from a single power supply voltage Vd. For that reason, the non-inverting input terminal of the operational amplifier OP1 is connected to the aforementioned mutual connection node NVref, which is held at the reference voltage Vref. The value of Vref can be approximately half of the supply voltage Vd. However it would be equally possible to supply the operational amplifier OP1 with power from a pair of positive and negative power supply voltages, in which case the reference voltage Vref could be the ground potential.

Figure 7:
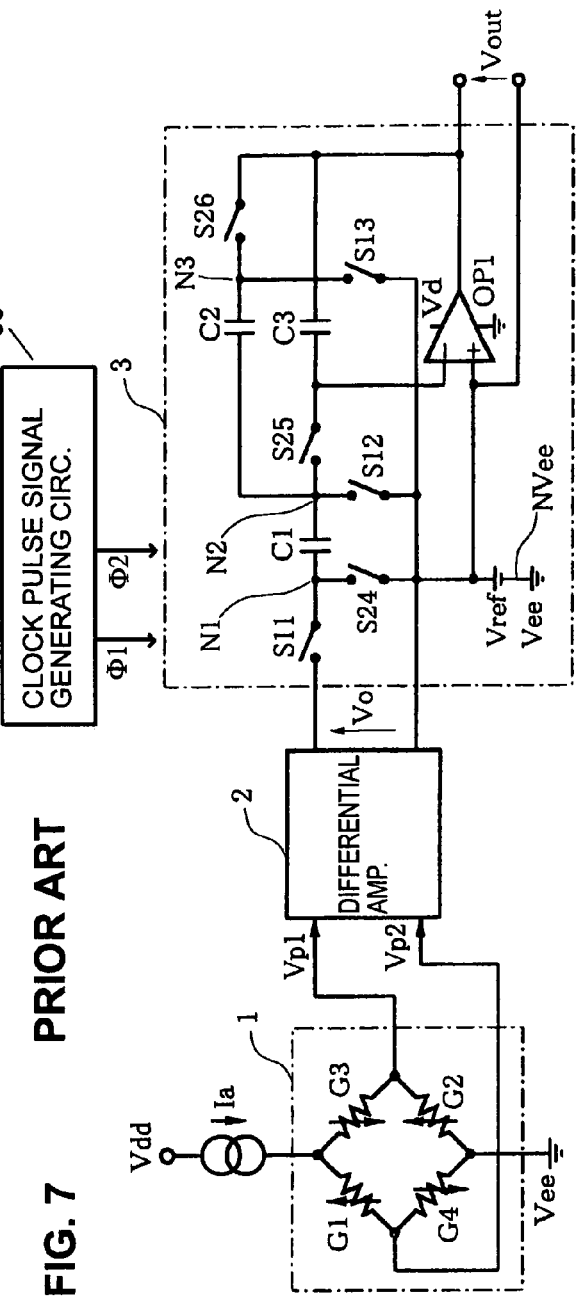
FIG. 7 shows the electrical configuration of an example of a prior art type of semiconductor pressure sensor apparatus.

This embodiment essentially differs from the prior art example of FIG. 7 described above with respect to the timing relationships between the first and second clock signals $\phi 1$, $\phi 2$ that are generated by the clock pulse signal generating circuit 40. Specifically, with this embodiment, the time interval which elapses between a falling edge of a pulse of the first clock signal $\phi 1$ (i.e., a transition of that clock signal from the active to the inactive level, whereby each analog switch that is controlled by that clock signal is changed from the conducting to the non-conducting state) and the rising edge of the succeeding pulse of the second clock signal $\phi 2$ (i.e., a transition of that clock signal from the inactive to the active level, whereby each analog switch that is controlled by that clock signal is set in the conducting state) is made as short as possible, insofar as it can be ensured that analog switches controlled by the first clock signal $\phi 1$ cannot enter the conducting state concurrently with any analog switches controlled by the second clock signal $\phi 2$.

Figure 5A:
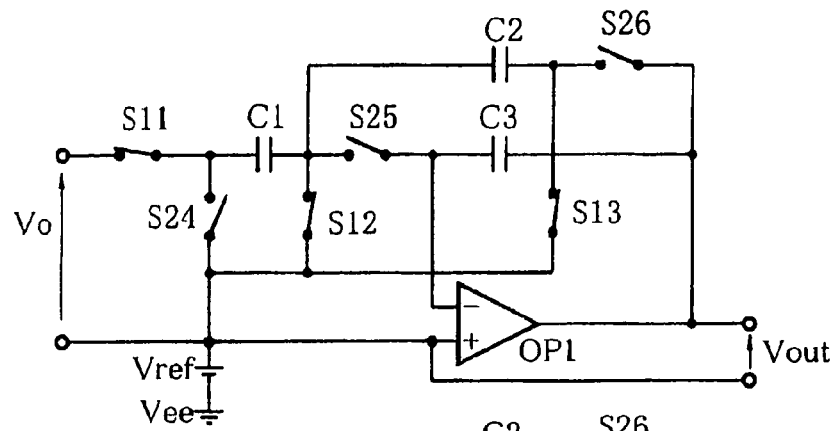
FIGS. 5A to 5D are circuit diagrams which illustrate successive switching conditions that are attained by a switched capacitor type of low-pass filter circuit.

During the first time interval, Phase 1, in which the first clock signal $\phi 1$ is at the active level and the second clock signal $\phi 2$ is at the inactive level, the connection condition of the low-pass filter 3 is as shown in FIG. 5A. The capacitor C1 is charged to the input voltage Vo while conversely the capacitor C2 is discharged to 0 V, and the charge in the capacitor C3 does not change.

Figure 5B:
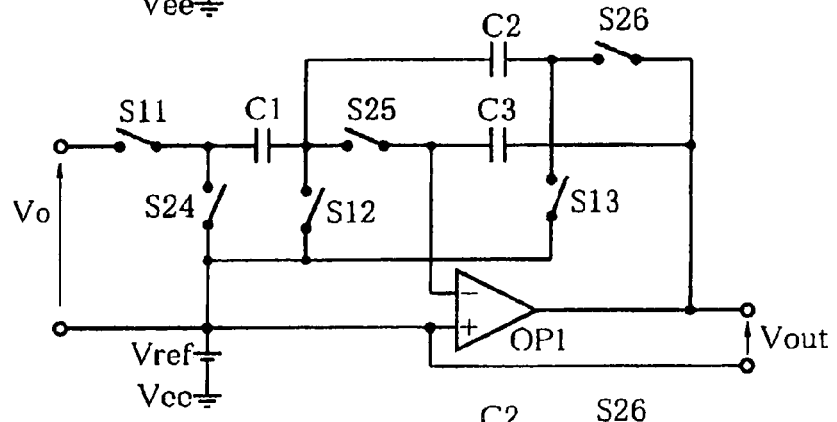

During the second time interval, Phase 2, as shown in FIG. 5B all of the switches S11, S12, S13, S24, S25, S26 are in the non-conducting state so that the charge in each of the capacitors C1, C2, C3 does not change. Thus, during Phase 2, (assuming that no charge is lost due to leakage current) the charges of the capacitors will remain unchanged from the condition at the end of Phase 1.

Figure 5C:
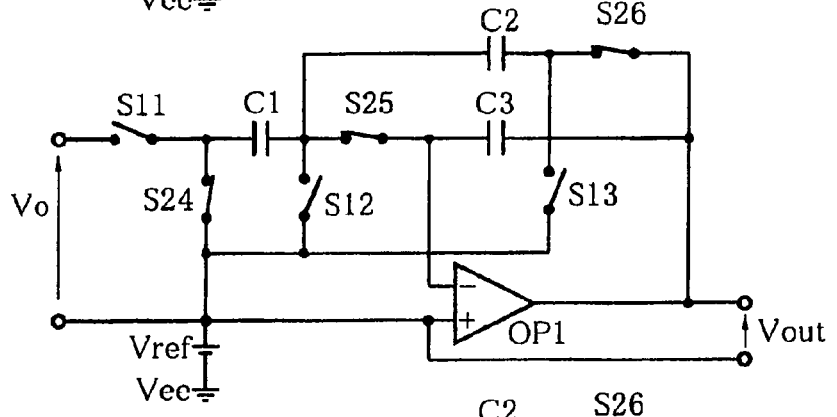

During the third time interval, Phase 3, since the first clock signal $\phi 1$ is at the inactive level and the second clock signal $\phi 2$ is at the active level, then the connection condition is as shown in FIG. 5C, with the capacitors C2 and C3 connected in parallel. The capacitor C1 is thereby connected between the inverting input terminal and the non-inverting input terminal of the operational amplifier OP1. Since these terminals are at the same potential, the capacitor C1 becomes discharged, and the resultant discharge current serves to charge each of the capacitors C2, C3. As discharge current from the capacitor C1 flows into the capacitor C2 as a charging current, a charging current also flows from the output terminal of the operational amplifier OP1, so that the capacitors C2 and c3 become charged to the same voltage.

Thus in the same way as described for the prior art example of FIG. 7, the output voltage Vo from the low-pass filter 3 changes by an amount that is equal to the amount of change in the voltage to which the capacitor C3 is charged.

Figure 5D:
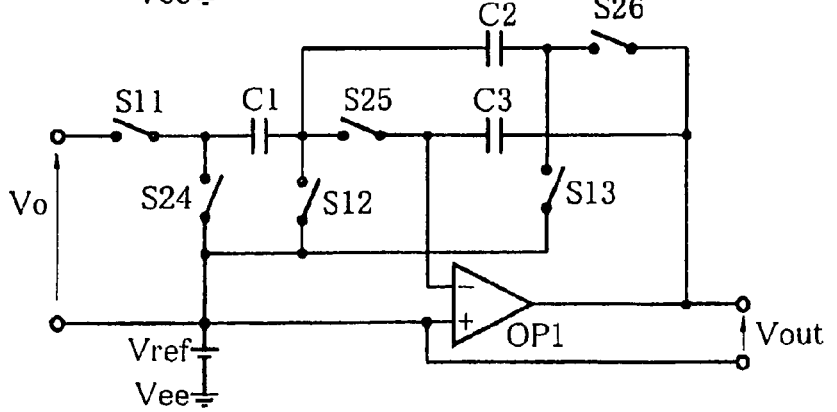
Figure 6:
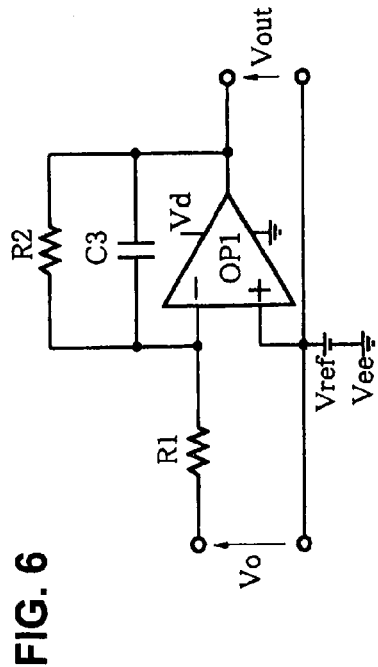
FIG. 6 is an equivalent circuit diagram of a switched capacitor type of low-pass filter circuit.

Finally in the fourth time interval, Phase 4, the condition becomes as shown in FIG. 5D, in which all of the analog switches are in the non-conducting state, in the same way as during Phase 3, so that the charge in each capacitor is held unchanged from that which existed at the end of Phase 3.

Figure 8:
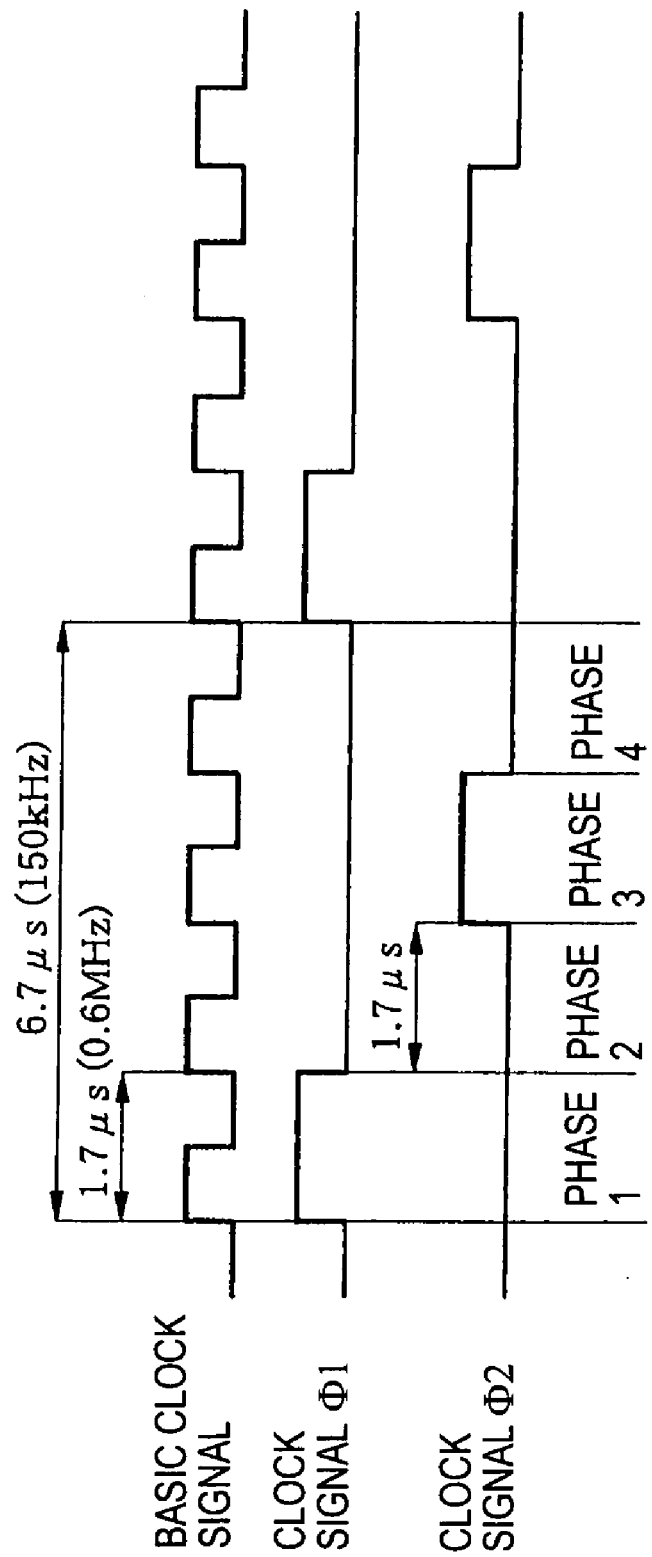
FIG. 8 is a timing diagram for describing the operation of a switched capacitor type of low-pass filter in the prior art example of FIG. 7.

It can thus be understood that with this embodiment, the circuit configuration of the low-pass filter 3 and the operation of that circuit based on the two-phase clock signals φ1, φ2 is essentially identical to that of the prior art example described hereinabove. However with this embodiment, the phase relationship between the two-phase clock signals φ1, φ2 differs from that of the prior art example, shown in the timing diagram of FIG. 8, i.e., with the phase relationships relationship between the two-phase clock signals φ1, φ2 for this embodiment being as shown in the timing diagram of FIG. 2.

Assuming that the required cut-off frequency for the low-pass filter 3 is extremely low, e.g., 1 Hz, then as described above, in order to be able to utilize capacitors which are of sufficiently small capacitance value to be formed on a semiconductor integrated circuit, it becomes necessary to lower the frequency of the basic clock signal to approximately 1.5 kHz as described hereinabove. In that case, with the prior art type of switched capacitor low-pass filter, the duration of the Phase 2 interval would be 170 microseconds, which is substantially long. Thus, the amounts of charge held in the capacitors C1, C2 would be strongly affected by leakage current flow which occurs in the analog switches that are connected to these capacitors. As a result, as described hereinabove, it would not be possible to correctly obtain the required gain in the low-frequency range, or the value of cut-off frequency that is expressed by equation (3) above, for the low-pass filter 3.

However the above embodiment of the present invention having the clock signal timing relationships shown in FIG. 2 differs from the prior art example in that the duration of the Phase 2 interval is made extremely short. Hence, satisfactory operation can be achieved with a cut-off frequency as low as 1 Hz, when the frequency of the two-phase clock signals φ1, φ2 is lowered to 1.5 kHz. It becomes possible to use small capacitance values for the capacitors of the low-pass filter, including C3.

Specifically, the duration of the Phase 2 interval should be made as short as possible, within a range of values whereby none of the analog switches that are controlled by the clock signal φ1 will be in the conducting state (i.e., ON state) concurrently with any of the analog switches that are controlled by the clock signal φ2.

In particular, since the leakage current of switching elements such as MOS field-effect transistors increases with temperature, the duration of the Phase 2 interval should be made as short as possible while ensuring that the above condition is satisfied (i.e, whereby there must be no overlap between conduction intervals of the analog switches that are controlled by the clock signal φ1 and conduction intervals of the analog switches that are controlled by the clock signal φ2) when the low-pass filter 3 is used at up to a predetermined maximum value of operating temperature. It can thereby be ensured that the operation of the low-pass filter 3 will not be affected by temperature-dependent increases in leakage currents of the analog switches.

Preferably, when high-speed MOS FETs are used as the analog switches, the duration of the Phase 2 interval should be within the range of 0.6 to 2 microseconds.

An alternative method of determining a suitable minimum duration for the Phase 2 interval is as follows. If there is significant loss of charge from the capacitors C1, C2 during each Phase 2 interval, then an error will arise in the value of DC gain of the low-pass filter 3, with respect to a target value of DC gain. That is to say, the magnitude of that gain error is substantially entirely determined by the rate of charge leakage from the capacitors C1, C2 during each Phase 2 interval, due to leakage current in the analog switches. A maximum value for that error in the DC gain can be predetermined, e.g., expressed as a proportion of the target value of DC gain, such as 3%. If the duration of the Phase 2 interval is made such that the proportion of charge reduction (of capacitor C1, for example) that occurs during each Phase 2 interval is equal to the predetermined maximum allowable amount of error in the DC gain of the low-pass filter 3 with respect to the target value (e.g., an error of 3%), then satisfactory operation can be achieved.

The amount of leakage of charge from the capacitor C1 during each Phase 2 interval can be measured directly, or can be obtained by measuring the levels of leakage current of the analog switches.

With such a short duration of the Phase 2 interval, it can be ensured that the charge on the capacitors C1, C2 during each Phase 2 interval will be left unchanged from the condition at the end of the preceding Phase 1 interval, i.e., the charge condition will not be affected by flows of leakage current in the analog switches that are connected to these capacitors, and so will be left unchanged until the start of the succeeding Phase 3 interval. Hence, the aforementioned problems of the prior art with respect to errors in the gain of the filter in the low-frequency range and in the value of cut-off frequency attained, can be overcome. It thus becomes possible to realize a low-pass filter which can have an extremely low value of cut-off frequency, such as 1 Hz, by using a switched capacitor type of circuit in which the capacitors are of sufficiently small value to be readily formed in an integrated circuit.

Figure 4:
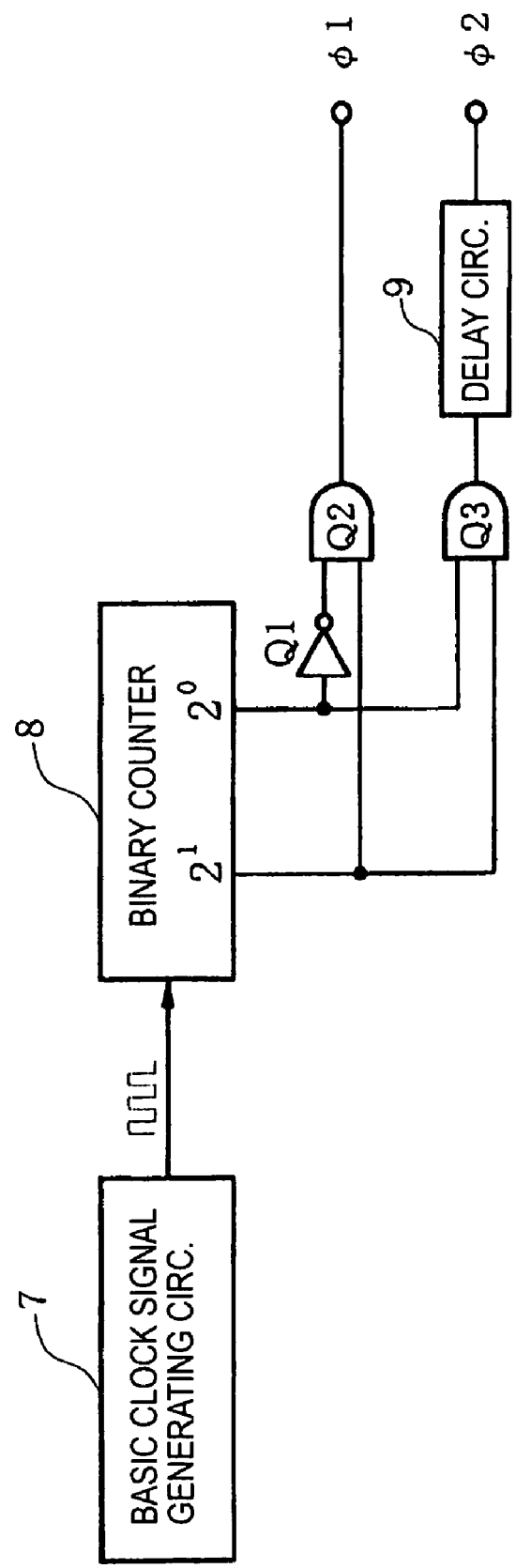
FIG. 4 is a circuit diagram of an example of a circuit for generating the two-phase clock signals that are used in the above embodiment.

With this embodiment, the two-phase clock signals φ1, φ2 are generated by the clock pulse signal generating circuit 40, whose internal circuit configuration can be as shown in the example of FIG. 4. With this circuit, a basic clock signal generating circuit 7 produces the basic clock signal at a frequency of 6 kHz, which is inputted to a 2-bit binary counter 8. The output from the $2^0$ stage of the binary counter 8 is inputted to an inverter Q1 and to one input of a 2-input AND gate Q3, with the output from the inverter Q1 being supplied to one input of a 2-input AND gate Q2, while the output from the $2^1$ stage of the binary counter 8 is supplied to the other input of the AND gate Q2 and to the other input of the AND gate Q3. The output produced from the AND gate Q2 consists of a train of pulses at a frequency of 1.5 kHz, i.e., with each pulse occuring when the binary counter 8 attains a count of 2. That pulse train is used as the clock signal φ1 of the circuit of FIG. 1.

The output from the 2-input AND gate Q3 also consists of a train of pulses each generated when the binary counter 8 attains a count of 3. These pulses are delayed by being transferred through a delay circuit 9 that produces a delay of approximately 1 μs, with the output from the delay circuit 9 constituting the clock signal φ2 of the circuit of FIG. 1, i.e., which also has a frequency of 1.5 kHz.

Thus by appropriately determining the delay amount produced by the delay circuit 9, the phase relationships between the two-phase clock signals φ1, φ2 are as shown in the timing diagram of FIG. 2, with an extremely short interval of approximately 1 μs between the end of a pulse of the clock signal φ1 and the start of the succeeding pulse of the clock signal φ2.

It can thus be understood from the above that with the present invention, since the operation of the low-pass filter is unaffected by leakage current which flows in the analog switches, it becomes possible to implement a switched capacitor type of low-pass filter that can have an extremely low value of cut-off frequency, and which can be configured with capacitor values which are sufficiently small that the capacitors can readily be formed within a semiconductor integrated circuit. Such a low-pass filter can be used to detect extremely low-frequency components of voltage variations, when the voltage variations include high-frequency components superimposed on the low-frequency components.

The invention thus enables a semiconductor pressure sensor apparatus to be realized which can detect extremely low-frequency components of pressure variations, and which utilizes a switched capacitor type of low-pass filter that is formed in an integrated circuit.

Furthermore although the low-pass filter of the present invention has been described in the above only with application to a sensor signal produced from a pressure sensor, it will be understood that such a low-pass filter is equally applicable to various other applications in which it is necessary to achieve a very low value of filter cut-off frequency for a low-pass filter whose components are formed entirely within a semiconductor integrated circuit.

What is claimed is:

1. A low-pass filter for detecting voltage variations of an input signal supplied to an input terminal thereof and producing and output signal indicative of said voltage variations, said low-pass filter including a switched capacitor circuit having clock signal generating circuit for generating a first clock pulse signal and a second clock pulse signal of mutually identical frequency and differing phase, first, second and third capacitors, a first plurality of switching elements each controlled by said first clock pulse signal, and a second plurality of switching elements each controlled by said second clock signal, an operational amplifier for producing said output signal from an output terminal thereof, a first capacitor selectively connectable between said low-pass filter input terminal and an input terminal of said operational amplifier via respective ones of said first and second pluralities of switching elements, a second capacitor selectively connectable between an input terminal of said operational amplifier and said output terminal of said operational amplifier via respective ones of said second plurality of switching elements, a third capacitor connected between said input terminal and output terminal of said operational amplifier, said low-pass filter configured to operate successively in:
  a first condition in which said first clock pulse signal is at an active level whereby each of said first plurality of switching elements is held in a conducting status and said second clock pulse signal is at an inactive level whereby each of said second plurality of switching elements is held in a non-conducting status, with said first capacitor being thereby charged to a voltage of said input signal, said second capacitor being discharged to a voltage of zero, and no charging or discharging of said third capacitor is performed,
  a second condition, in which each of said first clock pulse signal and second clock pulse signal is at said inactive level, whereby no charging or discharging of said first, second or third capacitors is performed,
  a third condition in which said first clock pulse signal is at said inactive level and said second clock pulse signal is at said active level, whereby each of said second plurality of switching elements is held in a conducting status and said second and third capacitors thereby become connected in parallel with one another, said first capacitor is discharged to a voltage of zero, and a discharge current from said first capacitor acts to charge said second and third capacitors, and
  a fourth condition in which each of said first clock pulse signal and second clock pulse signal is at said inactive level, whereby no charging or discharging of said first, second or third capacitors is performed,
with said first condition being subsequently returned to; wherein
said clock signal generating circuit comprises means for controlling said first and second pulse signals to set a duration of each interval of the second condition at a value whereby a decrease of stored charge in said first capacitor occurring within said interval, expressed as a percentage decrease with respect to an amount of said stored charge at commencement of said interval, is predetermined to be substantially equal to a maximum permissible amount of error of DC gain of said low-pass filter, with said error being no greater than 3 percent of a predetermined value of said DC gain, said duration extending between a transition of said first clock pulse signal from said active level to said inactive level and an immediately succeeding transition of said second clock pulse signal from said inactive level to said active level.

2. A low-pass filter as claimed in claim 1, wherein said switching elements are field effect transistors which exhibit leakage current flow, and wherein said duration of the second condition is made as short as possible within a range of values whereby none of said of first, second and third field effect transistors can enter said conducting status concurrently with any of said fourth, fifth and sixth field effect transistors while said low-pass filter is functioning at a predetermined maximum operating temperature thereof.

3. A low-pass filter as claimed in claim 1, wherein said duration of the second condition is set as a value within a range extending from 0.6 microseconds to 2 microseconds.

4. A semiconductor pressure sensor apparatus comprising:
  a semiconductor substrate having a region thereof formed to be thinner than surrounding regions to thereby constitute a diaphragm,
  a first pair of piezoresistive elements mounted on said diaphragm, each adapted to exhibit an increase in resistance when pressure is applied to said diaphragm,
  a second pair of piezoresistive elements mounted on said diaphragm, each adapted to exhibit a decrease in resistance when pressure is applied to said diaphragm, said piezoresistive elements being connected as an electrical bridge circuit, having a first connection point that connects a first one of said first pair of piezoresistive elements to a first one of said second pair of piezoresistive elements, a second connection point that connects a second one of said first pair of piezoresistive elements to a second one of said second pair of piezoresistive elements, a third connection point that connects said first one of said first pair of piezoresistive elements to said second one of said second pair of piezoresistive elements, and a fourth connection point that connects said second one of said first pair of piezoresistive elements to said first one of said second pair of piezoresistive elements,
  a source of an electric current that is passed between said first and second connection points, and
  a differential amplifier for amplifying a voltage difference between said second and third connection points;
wherein
an amplified output signal voltage produced from said differential amplifier is supplied to a low-pass filter as claimed in claim 1, for thereby detecting variations in pressure applied to said diaphragm.

5. A low-pass filter for detecting voltage variations of an input signal applied between first and second input terminals thereof and producing an output signal indicative of said voltage variations, said low pass filter including a switched capacitor circuit having first and second input terminals coupled to receive said input signal, a clock signal generating circuit for generating a first clock pulse signal and a second clock pulse signal of mutually identical frequency and differing phase, first, second and third capacitors, a set of first, second and third switching elements each controlled to be set in a conducting status when said first clock pulse signal is at an active level, a set of fourth, fifth and sixth switching elements each controlled to be set in said conducting status when said second clock pulse signal is at said active level, an operational amplifier which operates from a single power supply voltage and has an inverting input terminal thereof connected in common to a reference voltage having a value that is one-half of said power supply voltage and to said second input terminal of said switched capacitor circuit, said first switching element connected between said first input terminal of said switched capacitor circuit and a first mutual connection node, said fourth switching element connected between said first mutual connection node and a non-inverting input terminal of said operational amplifier, said first capacitor connected between said first mutual connection node and a second mutual connection node, said second switching element connected between said second mutual connection node and said non-inverting input terminal of said operational amplifier, said fifth switching element connected between said second mutual connection node and said inverting input terminal of said operational amplifier, said second capacitor connected between said second mutual connection node and a third mutual connection node, said third capacitor connected between said inverting input terminal of said operational amplifier and an output terminal of said operational amplifier, said third switching element connected between said third mutual connection node and said non-inverting input terminal of said operational amplifier, said sixth switching element connected between said third mutual connection node and said output terminal of said operational amplifier, with said output signal of said low-pass filter being produced between said output terminal of said operational amplifier and said non-inverting input terminal of said operational amplifier; wherein said clock signal generating circuit comprises means for generating said first clock signal and said second clock signal such that a duration of an interval which elapses between a transition of said first clock signal from said active level to an inactive level and an immediately succeeding transition of said second clock signal from said inactive level to said active level is set at a value whereby a decrease of stored charge in said first capacitor occurring within said interval, expressed as a percentage decrease with respect to an amount of said stored charge at commencement of said interval, is predetermined to be substantially equal to a maximum permissible amount of error of DC gain of said low-pass filter, with said error being not greater than 3 percent of a predetermined value of said DC gain.

6. A low-pass filter including a switched capacitor circuit, for detecting voltage variations of an input signal and producing an output signal indicative of said voltage variations, comprising:

first and second capacitors that are fixedly connected in series, an operational amplifier for producing said output signal from an output terminal thereof, having a third capacitor fixedly connected between said output terminal and a non-inverting input terminal of said operational amplifier, with said input signal being applied between an input terminal of said low-pass filter and said non-inverting input terminal, first and second pluralities of switching elements operable for establishing a plurality of respectively different connection conditions between said first, second and third capacitors and said input terminal of the low-pass filter, said non-inverting input terminal and said inverting input terminal of said operational amplifier, and said output terminal of said operational amplifier, and switching control means for selectively setting all of said first plurality of switching elements in a conducting state and in a non-conducting state and for selectively setting all of said second plurality of switching elements in a conducting state and in a non-conducting state, to establish said different connection conditions in a predetermined sequence, said switching control means periodically controlling said switching elements to sequentially establish during a first time interval, a condition in which said first capacitor is charged to a voltage of said input signal, while said second capacitor is discharged to zero and a charge of said third capacitor is left unchanged, during a second time interval, a condition in which no charging or discharging of said first, second or third capacitors occurs, during a third time interval, a condition in which said second and third capacitors are connected in parallel between said output terminal and inverting input terminal of said operational amplifier and are each charged from said first capacitor, causing a corresponding change in voltage across said third capacitor and a resultant change in output signal voltage from said operational amplifier, while said first capacitor is discharged to zero, and during a fourth time interval, a condition in which no charging or discharging of said first, second or third capacitors occurs;

wherein said switching control means is configured to establish a duration for said second time interval at a value whereby a decrease of stored charge in said first capacitor occurring within said interval, is predetermined to be substantially equal to a maximum permissible amount of error of DC gain of said low-pass filter, with said error being no greater than 3 percent of a predetermined value of said DC gain.

* * * * *

UNITED STATES PATENT AND TRADEMARK OFFICE
CERTIFICATE OF CORRECTION

PATENT NO. : 7,049,883 B2
APPLICATION NO. : 10/791790
DATED : May 23, 2006
INVENTOR(S) : Takanori Makino and Seiki Aoyama It is certified that error appears in the above-identified patent and that said Letters Patent is hereby corrected as shown below:

In claim 5, column 13, line 18, "an inverting input terminal"; should read --a non-inverting input terminal--.

In claim 6, column 14, line 11, "a non-inverting input terminal"; should read --an inverting input terminal--.

Signed and Sealed this

Fourteenth Day of November, 2006

JON W. DUDAS
*Director of the United States Patent and Trademark Office*